United States Patent [19]
Fujii et al.

[11] Patent Number: 5,380,503
[45] Date of Patent: Jan. 10, 1995

[54] STOCKER

[75] Inventors: Toshiaki Fujii; Hidetomo Suzuki, both of Kanagawa, Japan

[73] Assignee: Ebara Research Co., Ltd., Fujisawa, Japan

[21] Appl. No.: 29,639

[22] Filed: Mar. 11, 1993

[30] Foreign Application Priority Data

Mar. 13, 1992 [JP] Japan ................................. 4-088360

[51] Int. Cl.$^6$ .......................... B01J 19/08; A62B 7/08; B01D 50/00
[52] U.S. Cl. ................................ 422/243; 422/186.04; 422/186.1; 422/186.3; 422/121; 95/16; 95/64; 95/95; 95/98; 55/385.1
[58] Field of Search ................... 422/121, 243, 186.04, 422/186.1, 186.3; 95/16, 64, 95, 98; 55/385.1

[56] References Cited

U.S. PATENT DOCUMENTS

| | | | |
|---|---|---|---|
| 3,483,672 | 12/1969 | Jahnke | 422/121 |
| 3,782,905 | 1/1974 | Huang et al. | 422/121 |
| 4,010,374 | 3/1977 | Ramler et al. | 422/186.3 |
| 4,183,780 | 1/1980 | McKenna et al. | 422/186.3 |
| 4,750,917 | 6/1988 | Fujii | |
| 4,770,680 | 9/1988 | Machida et al. | 55/385.1 |
| 4,990,311 | 2/1991 | Hirai et al. | 422/186.3 |
| 5,060,805 | 10/1991 | Fujii et al. | |
| 5,112,370 | 5/1992 | Gazzano | 422/121 |

FOREIGN PATENT DOCUMENTS

| | | |
|---|---|---|
| 0241555 | 10/1987 | European Pat. Off. |
| 0483855 | 5/1992 | European Pat. Off. |
| 61-178050 | 8/1986 | Japan |
| 1266864 | 10/1989 | Japan |
| 2-303557 | 12/1990 | Japan |
| 3-108698 | 5/1991 | Japan |

OTHER PUBLICATIONS

"Air Cleaning of the Sealed Space by Photoelectric Effect", p. 349, Fujii, et al. (with partial English translation).
"High Purification of the Space by Photoelectrons", p. 411, Fujii, et al. (with partial English translation).
Man and His Ecosystem, Proceedings of the 8th World Clean Air Congress 1989, vol. 3, Sep. 11–15, 1989, pp. 735–740, K. Sakamoto, et al., "Charging of Aerosol Particles by Use of UV Irradiation".
Patent Abstracts of Japan, vol. 16, No. 118, (C-0922), Mar. 25, 1992, JP-A-32 88 559, Dec. 18, 1991.

*Primary Examiner*—Robert J. Warden
*Assistant Examiner*—Christopher Y. Kim
*Attorney, Agent, or Firm*—Oblon, Spivak, McClelland, Maier, & Neustadt

[57] ABSTRACT

A stocker for accommodating, storing or transporting articles in clean, contamination-free conditions for either a long time or temporarily. The stocker has a particle collector provided in a part thereof. The particle collector includes an irradiation source such as ultraviolet light source, and a photoelectron emitting material that emits photoelectrons on irradiation with irradiation energy from the irradiation source. The particle collector further includes an electric field forming electrode, and a charged particle collecting material. The space where the particle collector is provided is preferably partitioned from the other space of the stocker by an irradiation energy screening material.

17 Claims, 5 Drawing Sheets

STOCKER

BACKGROUND OF THE INVENTION

1. Field of the Invention

The present invention relates to a stocker for accommodating, storing or transporting articles. More particularly, the present invention relates to a stocker for accommodating, storing or transporting, for a long time or temporarily, articles (materials, semi-fabricated products, or finished products) such as liquid crystal display substrates or silicon wafers for forming semiconductor chips, or valuable articles in clean, contamination-free conditions.

2. Description of Prior Art

Prior art will be described below with regard to the process for producing liquid crystal displays.

The production of a liquid crystal display is carried out through a large number of steps. For example, the process for forming patterns on glass substrates formed with transparent electrically conductive films includes various steps, i.e., washing, coating of a photoresist, exposure, etching, drying, etc. The subsequent assembly process includes steps of formation of alignment film, firing, rubbing, printing of a sealing compound, bonding, and injection of a liquid crystal material.

Thus, the liquid crystal display producing process comprises a large number of steps. In addition, liquid crystal displays are increasing more and more in size and are showing an increasing tendency to become higher in precision. Consequently, patterns to be formed are demanded to further increase in the degree of fineness and precision. Accordingly, there is a rapidly increasing need for reducing defects generated in each individual step of the manufacturing process.

Effective ways of reducing defects include (1) to keep each step clean continuously, and (2) to carry out effective washing. It is a particularly effective way to keep each step clean (at a high degree of cleanliness) continuously.

Meantime, during the manufacturing process, liquid crystal display substrates, semi-fabricated products, etc. are temporarily accommodated, stored or transported in accordance with the kind of process carried out at each step.

For the accommodation or storage, it is general practice to use (1) equipment having an opening in a part thereof, e.g., a clean bench or a clean booth, or (2) a stocker having a closed structure isolated from the external environment, e.g., one which is equipped with an HEPA (High Efficiency Particulate Air Filter) or ULPA (Ultra Low Penetration Air Filter) filter so as to provide a dust removing function, or another which is provided with a dust removing function by a vacuum. For the transportation, a storage carrier with a closed structure which is provided with a dust removing function by a vacuum is generally used.

However, all of the above-described systems are inferior in performance, so that articles contained therein may be contaminated during accommodation, storage or transportation. For example, in the system that employs an ULPA filter, air is previously passed through the ULPA filter to purify the air, and the purified air is returned to the stocker so as to purge the inside thereof, thereby cleaning the inside of the stocker. With this system, since the air is forcedly circulated through the stocker, fine particles are generated therein. Accordingly, the system is limited in ability to realize ultra clean conditions. In addition, since fine particles in the stocker are forcedly circulated, they may adhere to valuable articles in the stocker, thus giving rise to a problem.

Further, the prior art systems that employ a vacuum for dust removing purposes are difficult to handle.

Thus, the conventional systems have practical problems to be solved.

SUMMARY OF THE INVENTION

In view of the above-described problems of the prior art, it is an object of the present invention to provide a high-performance stocker which is easy to handle and capable of preventing contamination.

To attain the above-described object, the present invention provides a stocker for accommodating, storing or transporting articles, which has a particle collector provided in a part thereof. The particle collector includes an irradiation source such as an ultraviolet light source, and a photoelectron emitting material that emits photoelectrons upon irradiation with irradiation energy from the irradiation source. The particle collector further includes an electric field forming electrode, and a charged particle collecting material.

The space where the particle collector is provided is preferably divided from the other space of the stocker by an irradiation energy screening material.

Depending upon the scale and configuration of the stocker and the use application, the particle collector may be unitized by surrounding the irradiation source such as the ultraviolet light source with the photoelectron emitting material and the electrode, so that the unitized particle collector can be properly installed in any desired space in the stocker where fine particles are present.

Next, the arrangements of the constituent elements of the present invention will be explained in detail.

In the present invention, it is possible to use any photoelectron emitting material which emits photoelectrons on irradiation with ultraviolet light. It is preferable to use a photoelectron emitting material having a smaller photoelectric work function. Examples of photoelectron emitting materials which are preferable from the viewpoint of effectiveness and economy are Ba, St, Ca, Y, Gd, La, Ce, Nd, Th, Pr, Be, Zr, Fe, Ni, Zn, Cu, Ag, Pt, Cd, Pb, Al, C, Mg, Au, In, Bl, Nb, Sl, Tl, Ta, U, B, Eu, Sn, P, W, and compounds, alloys and mixtures of these elements. These materials may be used alone or in the form of a composite material comprising two or more materials. A physical composite material such as amalgam is also usable.

Examples of usable compounds include oxides, borides, and carbides. Examples of oxides are $BaO$, $SrO$, $CaO$, $Y_2O_5$, $Gd_2O_3$, $Nd_2O_3$, $ThO_2$, $ZrO_2$, $Fe_2O_3$, $ZnO$, $CuO$, $Ag_2O$, $La_2O_3$, $PtO$, $PbO$, $Al_2O_3$, $MgO$, $In_2O_3$, $BiO$, $NbO$, and $BeO$. Examples of borides are $YB_6$, $GdB_6$, $LaB_5$, $NdB_6$, $CeB_6$, $BuB_6$, $PrB_6$, and $ZrB_2$. Examples of carbides are $UC$, $ZrC$, $TaC$, $TiC$, $NbC$, and $WC$.

Examples of usable alloys include brass, bronze, phosphor bronze, an alloy of Ag and Mg (Mg: 2 to 20 wt %), an alloy of Cu and Be (Be: 1 to 10 wt %), and an alloy of Ba and Al. The Ag-Mg alloy, Cu-Be alloy and Ba-Al alloy are preferable. Oxides can also be obtained by heating only the surface of a metal in air, or oxidizing it with a chemical.

It is also possible to form an oxide layer on the surface of a photoelectron emitting material by heating it before use to obtain an oxide layer which is stable for a long period of time. As one example of this method, an oxide film can be formed on the surface of an alloy of Mg and Ag in water vapor under a temperature condition of 300° C. to 400° C. The oxide thin film obtained in this way is stable for a long period of time.

In addition, a photoelectron emitting material that is formed in a multi-layer structure, as has already been proposed by the present inventors, may also suitably be used (see Japanese Patent Public Disclosure No. 3-108698 (1991)).

It is also possible to use a photoelectron emitting material formed by coating a thin film of substance capable of emitting photoelectrons on a proper base material (see Japanese Patent Public Disclosure No. 4-152296 (1992)). As one example of this photoelectron emitting material. Au as a substance capable of emitting photoelectrons is coated in the form of a thin film on silica glass as a substance permeable to ultraviolet light (base material) (see Japanese Patent Public Disclosure No. 4-171062 (1992)).

When a photoelectron emitting material that is coated on a base material is used, an electrically conductive substance may also be added thereto, as has already been proposed by the present inventors (see Japanese Patent Application No. 3-258718 (1991)).

The photoelectron emitting material may be used in various forms, e.g., a rod-shaped configuration, a cottony configuration, a lattice-shaped configuration, a plate-shaped configuration, a pleated configuration, a configuration with a curved surface, a circular cylindrical configuration, a net-shaped configuration, etc. It is preferable to employ a configuration which provides a large area for irradiation with ultraviolet light. Depending upon the type of particle collector, it is preferable to employ a configuration whereby fine particles present in a space to be treated (described later) can move rapidly to a particle collecting part (described later).

Depending upon the type of particle collector, it is possible to use a photoelectron emitting material which is provided (coated) in the form of a thin film on or near the surface of an ultraviolet light source, for example, an ultraviolet lamp, thereby unitizing them together (see Japanese Patent Public Disclosure No. 4-243540 (1992).

The configuration of the photoelectron emitting material in actual use may be properly determined according to the scale of the stocker and the type of particle collector used, as will be described later.

As an irradiation source used in this invention, there is no specific restriction on the irradiation source used to cause the photoelectron emitting material to emit photoelectrons. It is possible to use any type of irradiation source which can induce emission of photoelectrons by irradiation. In addition to ultraviolet light, employed in the examples of the present invention, electromagnetic wave, laser, or radiation may be properly selected for use by taking into consideration the field of application, the scale and configuration of the stocker, effectiveness, etc. Among these irradiation sources, ultraviolet light is usually preferable from the viewpoint of effectiveness and controllability.

Any kind of ultraviolet light may be used, provided that it is possible to cause the photoelectron emitting material to emit photoelectrons by irradiation with it, in some fields of application, ultraviolet light which also has germicidal (sterilizing) action is preferably used. The kind of ultraviolet light may be properly determined according to the application field, the contents of operation, the use application, economic factor, etc. For example, in the biological field, far ultraviolet light is preferably used jointly from the viewpoint of germicidal action and efficiency.

There is no specific restriction on the ultraviolet light source used in the present invention. Any source which emits ultraviolet light may be properly selected by taking into consideration the application field, the configuration and structure of the stocker, effectiveness, economic factor, etc. For example, a mercury vapor lamp, a hydrogen discharge tube, a xenon discharge tube, a Lyman discharge tube, etc. may be properly used. In the biological field, ultraviolet light having a germicidal (sterilizing) wavelength of 254 nm is preferably used with a view to additionally providing a germicidal (sterilizing) effect.

Next, the positions and configurations of the photoelectron emitting material and the electric field forming electrode will be explained. The photoelectron emitting material and/or the electrode is installed in a proper part of the space where fine particles are present so that an electric field can be formed in between the electrode and the photoelectron emitting material. Thus, an electric field is formed in between the photoelectron emitting material (−) and the electrode (+). The electric field allows photoelectrons to be efficiently emitted from the photoelectron emitting material.

The positions and configurations of the photoelectron emitting material and the electrode may be properly selected according to the scale of the stocker and the type of particle collector. The photoelectron emitting material and the electrode may be each disposed at any position and in any configuration, provided that the voltage applied to form an electric field can be lowered as much as possible and yet fine particles in the space are effectively charged by photoelectrons emitted from the photoelectron emitting material so that the charged particles can be effectively collected. Depending upon the type of particle collector, a configuration in which the photoelectron emitting material and the electrode surround the ultraviolet light source, e.g., an ultraviolet lamp, may be properly employed (see Japanese Patent Application No. 3-261289 (1991)). The configurations of the photoelectron emitting material and the electrode may be properly determined by carrying out a preliminary test with the application field, the scale and configuration of the stocker, effectiveness, economic factor, etc., being taken into consideration.

In general, when the scale of the stocker is small, e.g., less than several 100 l in capacity, the particle collector is provided on the wall surface of the stocker to effect cleaning. Accordingly, the photoelectron emitting material and the electrode are installed so as to extend vertically along the wall surface of the stocker.

When the scale of the stocker is large, e.g., more than several 100 l in capacity, since fine particles in the space to be treated take a relatively long time to move to the particle collector by diffusion, one or a plurality of unitized particle collectors, each formed by surrounding the ultraviolet light source with the photoelectron emitting material and the electrode, are installed at proper positions in the space of the stocker. The photoelectron emitting material and the electrode in each of the unitized particle collector are usually formed in a configuration with a curved surface, e.g., a circular cylindrical configuration, because these elements surround the ultraviolet light source.

For the electrode, any kind of electrically conductive material can be used. Various kinds of electrode material employed in known electrostatic precipitators can suitably be used.

The light screening material, which features the present invention, will be explained below.

The light screening material is employed (1) to avoid adverse effect of the ultraviolet irradiation on articles accommodated in the stocker when such a problem is likely to occur, and (2) to avoid generation of fine particles in the space to be treated by irradiation with ultraviolet light of short wavelength when the ultraviolet radiation from the ultraviolet light source employed includes such short wavelength ultraviolet light.

In other words, when there is no likelihood that the problems stated in (1) and (2) will occur, no light screening material is needed. However, it is generally preferable to keep articles from direct irradiation with ultraviolet light. In addition, even if short wavelength ultraviolet light is ignorable in the early stages, there is a possibility that short wavelength ultraviolet light will be emitted due to deterioration of the ultraviolet light source as a result of long-term service. In view of the above and from the viewpoint of safety in emergency, it is preferable to install a light screening material.

Any kind of light screening material may be used, provided that the light screening material employed can be installed so as to prevent ultraviolet light from the ultraviolet light source from directly irradiating the space to be treated. The installation position of the light screening material is in between the particle collecting part and the space to be treated. There is no specific restriction on the configuration of the light screening material. It is possible to employ any configuration which allows fine particles present in the space to be treated to move to the particle collecting part. In general, it is possible to use a plate-shaped configuration, a lattice-shaped configuration, a pleated configuration, a net-shaped configuration, or a configuration with a curved surface. The light screening material may have one or a combination of two or more properly selected from among the above-mentioned configurations.

The light screening material may be united with the particle collector, depending upon the configuration of the collector. It is also possible to provide the light screening material with the function of a photoelectron emitting material. The light screening material may also be used as a photoelectron emitting material. These uses of the light screening material may be properly determined according to the application field, the configuration and scale of the stocker, effectiveness, etc.

As to the charged particle collecting material (dust collecting material), there is no specific restriction on it. Any kind of material which can collect charged particles can be used. Common examples are various kinds of electrode material such as those used for dust collecting plates and dust collecting electrodes in ordinary electrostatic precipitators, and a dust collecting material used in an electrostatic filter system. A dust collecting material having a woolly structure in which the collecting part itself constitutes an electrode, such as a steel wool electrode or a tungsten wool electrode, can also effectively be used. An electret material can also suitably be used.

Among the above-mentioned charged particle collecting materials, various kinds of electrode material, e.g., those used for dust collecting plates and dust collecting electrodes, or woolly electrode materials such as steel wool electrodes, and tungsten wool electrodes, are particularly preferable because these electrode materials can serve as both an electric field forming electrode and a charged particle collecting material.

The electric field voltage employed in the present invention ranges from 0.1 V/cm to 2 kV/cm. A suitable electric field intensity may be properly determined by conducting a preliminary test and an examination with the application field, conditions, the configuration and scale of the stocker, effectiveness, economic factor, etc. being taken into consideration.

The type (configuration and scale) of particle collector employed may be properly selected by conducting a preliminary test with the application field, the scale and configuration of the stocker, effectiveness, economic factor, etc. being taken into consideration. In general, as stated above, when the scale of the stocker is small, e.g., less than several 100 l in capacity, a particle collector in which the photoelectron emitting material and the electrode are installed so as to extend vertically along the wall surface of the stocker, is employed. When the scale of the stocker is large, e.g., more than several 100 l in capacity, a unitized particle collector in which the ultraviolet light source is surrounded by the photo-electron emitting material and the electrode is employed. More specifically, when the scale of the stocker is large, fine particles in the space to be treated take a relatively long time to move to the particle collector by diffusion. Therefore, one or a plurality of unitized particle collectors are installed at proper positions in the space of the stocker.

Further, in the case of a large-scale stocker, it is practically important to maximize the energy efficiency, that is, to use effectively the ultraviolet radiation energy. Since the unitized particle collector has the ultraviolet light source surrounded by the photoelectron emitting material, all of the ultraviolet radiation can be effectively used. Accordingly, the unitized particle collector provides a great practical advantage, particularly when it is used for a large-scale stocker.

The above and other objects, features and advantages of the present invention will become more apparent from the following description when taken in conjunction with the accompanying drawings in which preferred embodiments of the present invention are shown by way of illustrative examples.

BRIEF DESCRIPTION OF THE DRAWINGS

FIGS. 4(a) and 4(b) show the basic arrangement of a unitized particle collector employed in the wafer stocker shown in FIG. 3, wherein FIG. 4(a) is a vertical sectional view of the particle collector and FIG. 4(b) is a horizontal sectional view of the same.

FIGS. 8(a) and 8(b) show the basic arrangement of a unitized particle collector employed in the wafer stocker shown in FIG. 7, wherein FIG. 8(a) is a vertical sectional view of the particle collector and FIG. 8(b) is a horizontal sectional view of the same.

PREFERRED EMBODIMENTS OF THE INVENTION

Figure 1:
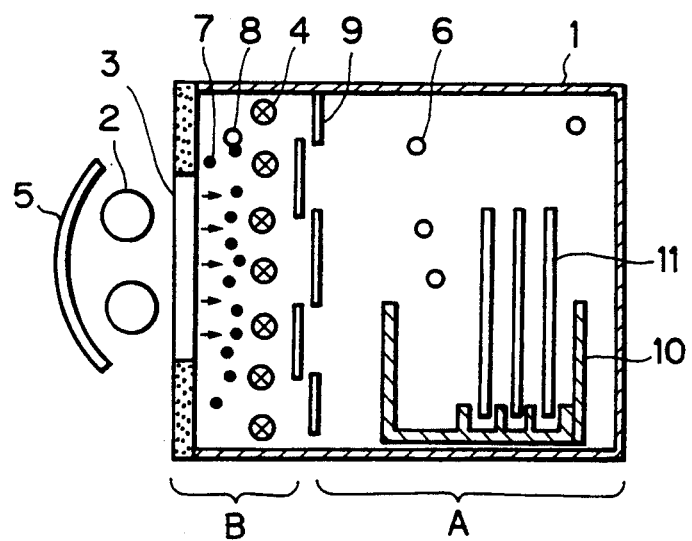
FIG. 1 shows a one embodiment of the present invention, in a sectional view.

The present invention will be described below more specifically by way of embodiments. However, it should be noted that the present invention is not necessarily limited to these embodiments.

Embodiment 1

Air cleaning in a wafer stocker employed in a semiconductor factory will be explained below with reference to FIG. 1 which shows the basic arrangement of the present invention. Air cleaning in the wafer stocker 1 is carried out by an ultraviolet lamp 2 installed at one side of the wafer stocker 1, an ultraviolet light reflector 5, a photoelectron emitting material 3, an electrode 4 for forming an electric field, and a charged particle collecting material (that is, a particle collector). It should be noted that in this arrangement the electrode also serves as a charged particle collecting material.

More specifically, fine particles (particulate matter) 6 in the wafer stocker 1 are electrically charged by photoelectrons 7 emitted from the photoelectron emitting material 3 irradiated with ultraviolet light from the ultraviolet lamp 2, and the resulting charged particles 8 are collected by the charged particle collecting material 4 (in the particle collecting part B). Thus, the space to be treated where wafers are present (the space part A to be cleaned) is cleaned to a high degree of cleanliness.

In this example, a light screening material 9 is installed in between the space part A to be treated and the particle collecting part B. The light screening material 9 comprises a plurality of metal plates which are combined to each other. The light screening material 9 is provided at the upper, center and lower portions thereof with openings for providing communication between the space part A to be treated and the particle collecting part B so that fine particles 6 present in the space part A can move to the particle collecting part B.

The photoelectron emitting material 3 used in this embodiment comprises a thin film of Au coated on the surface of a glass material. With regard to a photoelectron emitting material having such an arrangement, another invention has already been made by the present inventors (see Japanese Patent Application No. 2-295423 (1990)).

Thus, the fine particles (particulate matter) 6 in the wafer stocker 1 are collected and removed, so that the air in the wafer stocker 1 becomes ultra clean.

In the above-described arrangement, application of ultraviolet light to the photoelectron emitting material 3 is made by using the reflector 5 having a curved surface, thereby efficiently irradiating the plate-shaped photoelectron emitting material 3 with ultraviolet light from the ultraviolet lamp 2.

The electrode 4 is installed in order to perform photoelectron emission from the photoelectron emitting material 3 in an electric field. That is, the electrode 4 forms an electric field in the area between the photoelectron emitting material 3 and the electrode 4 (i.e., a photoelectron emitting part).

Charging of fine particles is efficiently carried out by photoelectrons 7 that are generated by irradiating the photoelectron emitting material 3 with ultraviolet light in the electric field.

The electric field voltage in this example is 50 V/cm.

Collection of the charged particles is effected by using the electrode 4. The electrode 4 is formed from a net-shaped Cu-Zn electrode material plated with gold. The electrode 4 is installed at a position 1 cm from the photoelectron emitting material 3 (i.e., a position of 0.03 with respect to the overall length (A+B) of 1). Reference numerals 10 and 11 denote a wafer carrier and wafers, respectively.

In this example, an air flow stirring part (not shown) is preferably provided in the wafer stocker 1 with a view to increasing the rate of removal of fine particles. Stirring of the air flow may be effected by a heating or cooling part arranged to provide a temperature difference or by a mechanical stirring part. These stirring methods may be properly used.

Although in this example a wall surface of the wafer stocker 1 is formed from the photoelectron emitting material 3 and the electrode 4 and the light screening material 9 are installed in the space where fine particles are present, the light screening material 9 may be provided with the function of emitting photoelectrons (for example, a Cu-Zn material is coated with Au to form a (−) electrode). In this case, photoelectron emission is made from both the photoelectron emitting material 3 and the light screening material 9. Thus, fine particles are charged even more effectively.

Figures 2A, 2B, 2C:
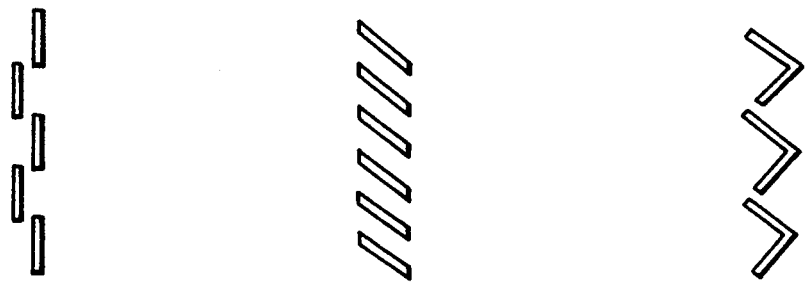
FIG. 2 (a), (b), (c) respectively shows an example of the configuration of a light screening material, employed in the present invention, in sectional view.

The arrangement and configuration of the light screening material 9 are not limited to those shown in FIG. 1. FIGS. 2(a), (b), (c) respectively show other examples of the arrangement and configuration of the light screening material in sectional view.

Embodiment 2

Figure 3:
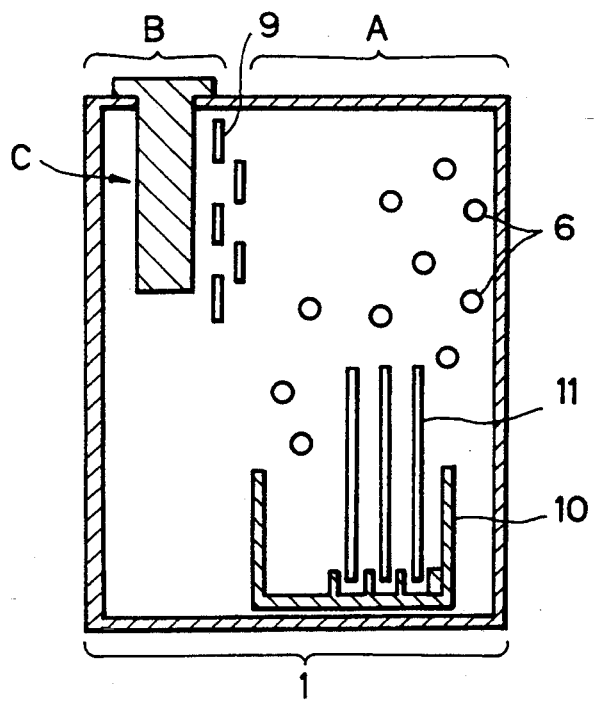
FIG. 3 is a sectional view of a wafer stocker in another embodiment of the present invention.

In this embodiment, air cleaning of a wafer stocker employed in a semiconductor factory is carried out by using a unitized particle collector in which an ultraviolet lamp as an ultraviolet light source is surrounded by a photoelectron emitting material and an electrode. This embodiment will be explained below with reference to FIGS. 3 and 4(a) and 4(b). FIG. 3 is a sectional view of a wafer stocker 1. Cleaning of air in the wafer stocker 1 is carried out by using a unitized particle collector C installed in the space (the particle collecting part B) of the stocker 1.

As shown in 4(a) and 4(b), which illustrate its basic arrangement, the particle collector C (in the part B) comprises an ultraviolet lamp 2, a photoelectron emitting material 3 formed from a circular cylindrical glass base material coated with Au so as to surround the ultraviolet lamp 2, and a net-shaped electrode 4 formed in a circular cylindrical configuration so as to surround the photoelectron emitting material 3.

Figures 4A, 4B:
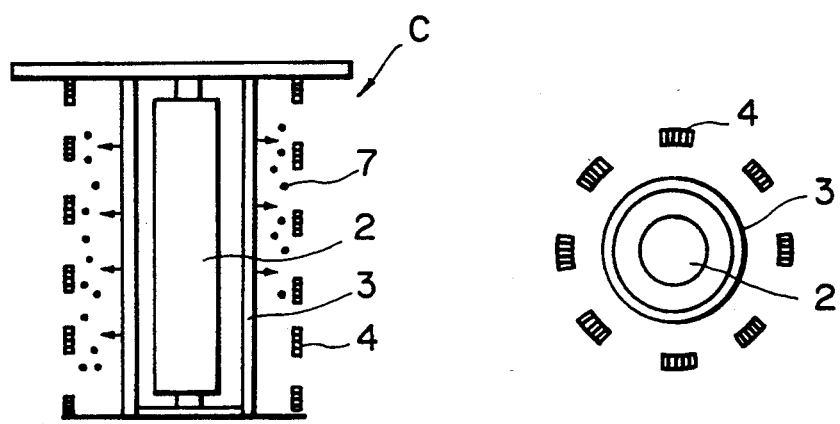

More specifically, fine particles (particulate matter) 6 in the wafer stocker 1 are electrically charged by photoelectrons 7 emitted from the photoelectron emitting material 3 irradiated with ultraviolet light from the ultraviolet lamp 2, shown in FIGS. 4(a) and 4(b), and the resulting charged particles are collected by the charged particle collecting material 4. Thus, the space A to be cleaned where wafers are present is cleaned to a high degree of cleanliness.

The photoelectron emitting material 3 used in this arrangement has a thin Au film of 50 Å in thickness coated on the surface of a glass material.

Thus, the fine particles (particulate matter) 6 in the wafer stocker 1 are collected and removed, so that the air in the wafer stocker 1 becomes ultra clean.

Reference numeral 9 denotes a light screening material. Reference symbol B denotes a particle collecting part.

The electrode 4 is installed in order to perform photoelectron emission from the photoelectron emitting material 3 in an electric field. That is, the electrode 4 forms an electric field in the area between the photoelectron emitting material 3 and the electrode 4. Charging of fine particles is efficiently carried out by photoelectrons 7 that are generated by irradiating the photoelectron emitting material 3 with ultraviolet light in the electric field. The electric field voltage in this example is 50 V/cm.

Collection of the charged particles is effected by using the electrode 4. The electrode 4 is formed from a net-shaped Cu-Zn electrode material plated with gold. The electrode 4 is installed at a position 1 cm from the photoelectron emitting material 3. Reference numerals 10 and 11 denote a wafer carrier and wafers, respectively.

Embodiment 3

Figure 5:
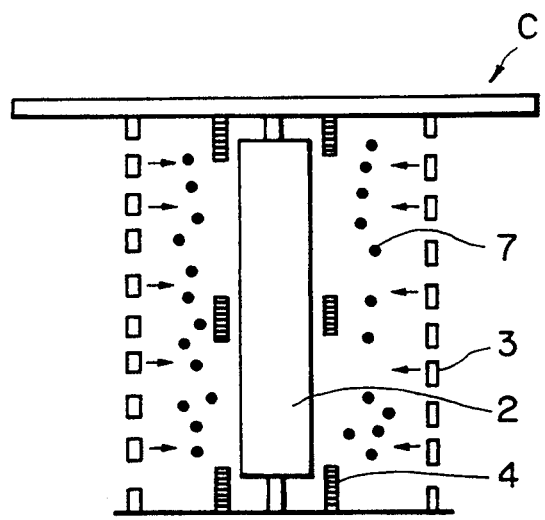
FIG. 5 shows another example of the unitized particle collector, which has a structure different from that shown in FIGS. 4(a) and 4(b)

FIG. 5 shows another embodiment of the unitized particle collector in Embodiment 2, which has a structure different from that shown in FIGS. 4(a) and 4(b).

The particle collector C comprises an ultraviolet lamp 2, a net-shaped electrode 4 formed in a circular cylindrical configuration so as to surround the ultraviolet amp 2, and a net-shaped photoelectron emitting material 3 formed from a circular cylindrical Cu-Zn base material coated with Au so as to surround the electrode 4.

Reference numeral 7 denotes photoelectrons.

Embodiment 4

Figure 6:
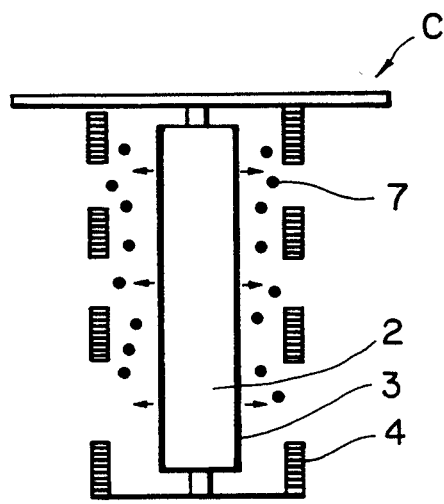
FIG. 6 shows still another example of the unitized particle collector, which has a structure different from that shown in FIGS. 4(a) and 4(b)

FIG. 6 shows still another embodiment of the unitized particle collector in Example 2, which has a structure different from that shown in FIGS. 4(a) and 4(b). That is, the particle collector C employs an ultraviolet lamp 2 having a thin film of Au, as a photoelectron emitting material 3, coated on the surface thereof (i.e., the ultraviolet lamp and the photoelectron emitting material are united with each other).

Thus, the particle collector comprises an ultraviolet lamp 2 having a thin film of photoelectron emitting material 3 coated on the surface thereof as one unit, and a net-shaped electrode 4 formed in a circular cylindrical configuration so as to surround the ultraviolet lamp 2.

In this example, the photoelectron emitting material 3 coated on the ultraviolet lamp 2 is Au of 100 Å in thickness. Reference numeral 7 denotes photoelectrons.

Embodiment 5

In this embodiment, air cleaning of a wafer stocker employed in a semiconductor factory is carried out by using a unitized particle collector in which an ultraviolet lamp as an ultraviolet light source is surrounded by a photoelectron emitting material and an electrode, either of which also serves as a light screening material. This embodiment will be explained below with reference to FIGS. 7 and 8(a) and 8(b).

Figure 7:
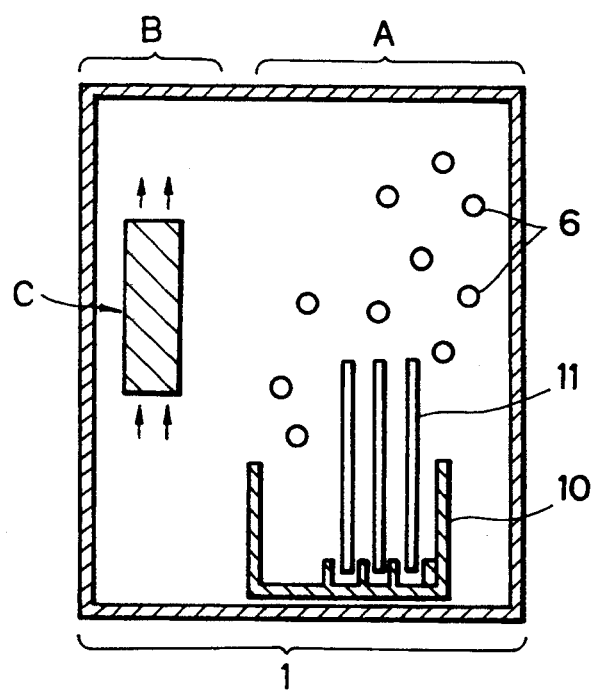
FIG. 7 is a sectional view of a wafer stocker in another embodiment of the present invention.

FIG. 7 is a sectional view of a wafer stocker 1. Cleaning of air in the wafer stocker 1 is carried out by using a unitized particle collector C installed in the space (part B) of the stocker 1.

Figure 8A:
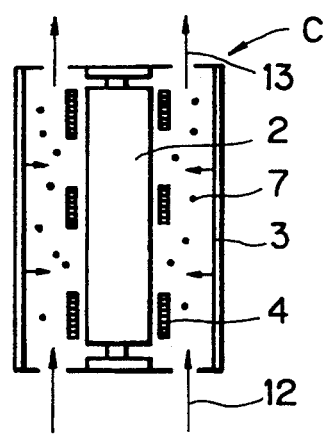
Figure 8B:
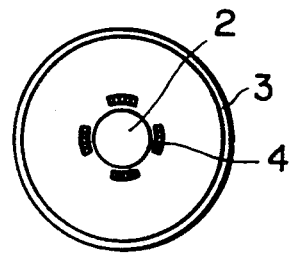

As shown in FIGS. 8(a) and (b), which Illustrates its basic arrangement, the particle collector C (in the part B) comprises an ultraviolet lamp 2, a net-shaped electrode 4 formed in a circular cylindrical configuration so as to surround the ultraviolet lamp 2, and a photoelectron emitting material 3 formed from a circular cylindrical Cu-Zn base material coated with Au so as to surround the electrode 4. In this example, the electric field forming electrode also serves as a charged particle collecting material.

More specifically, fine particles 6 in the wafer stocker 1 are electrically charged by photoelectrons 7 emitted from the photoelectron emitting material 3 irradiated with ultraviolet light from the ultraviolet lamp 2, shown in FIGS. 8(a) and (b), and the resulting charged particles are collected by the charged particle collecting material 4. Thus, the space A to be cleaned where wafers are present is cleaned to a high degree of cleanliness.

The photoelectron emitting material 3 used in this example is formed from a circular cylindrical Cu-Zn (brass) material plated with Au. Thus, the fine particles (particulate matter) 6 in the wafer stocker 1 are collected and removed, so that the space in the wafer stocker 1 becomes ultra clean.

In this example, the photoelectron emitting material 3 also serves as a light screening material.

The function of the electrode 4 is the same as the above. That is, the electrode 4 forms an electric field in the area between the photoelectron emitting material 3 and the electrode 4. The electric field voltage in this example is 50 V/cm.

Reference numerals 10 and 11 denote a wafer carrier and wafers, respectively.

Reference numerals 12 and 13 denote directions of air flow. The arrows 12 show the streams of air at the inlet, while the arrows 13 show the streams of air at the outlet. The air flow is naturally induced by heat generated from the ultraviolet lamp 2. Thus, fine particles 6 in the stocker 1 are effectively carried by the air flow to the photoelectron emitting part (the area between the photoelectron emitting material 3 and the electrode 4) in the particle collector where the fine particles 6 are charged and collected.

Embodiment 6

Figure 9:
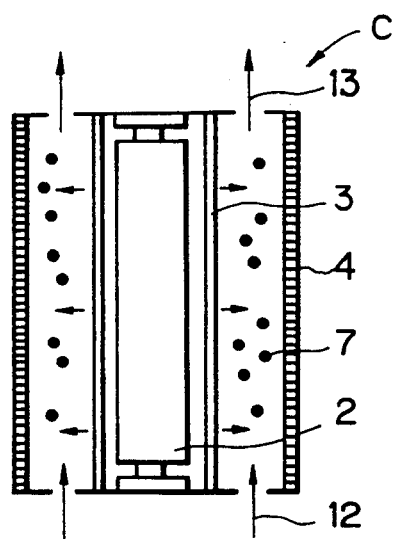
FIG. 9 shows another embodiment of the unitized particle collector, which has a structure different from that shown in FIGS. 8(a) and (b)

FIG. 9 shows another embodiment of the unitized particle collector in Embodiment 5, which has a structure different from that shown in FIGS. 8(a) and (b).

The particle collector C comprises an ultraviolet lamp 2, a photoelectron emitting material 3 formed from a circular cylindrical glass base materlal coated with Au so as to surround the ultraviolet lamp 2, and an electrode 4 formed in a circular cylindrical configuration so as to surround the photoelectron emitting material 3.

Reference numeral 7 denotes photoelectrons. The arrows 12 show the flow at the inlet, while the arrows 13 show the flow at the outlet.

In this embodiment, the electrode 4 also serves as a light screening material.

Embodiment 7

Figure 10:
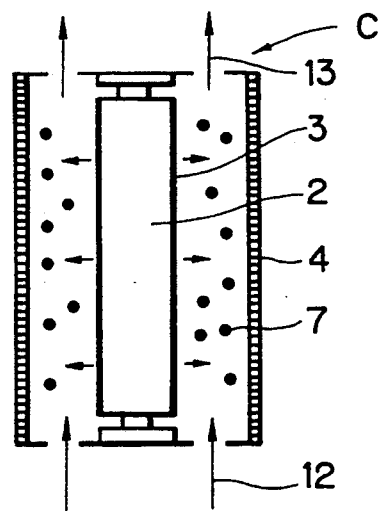
FIG. 10 shows still another embodiment of the unitized particle collector, which has a structure different from that shown in FIGS. 8(a) and (b).

FIG. 10 shows still another embodiment of the unitized particle collector in Embodiment 5, which has a structure different from that shown in FIG. 8(a) and (b). That is, the particle collector C employs an ultraviolet lamp 2 having a thin film of Au, as a photoelectron emitting material 3, coated on the surface thereof (i.e., the ultraviolet light source and the photoelectron emitting material are united with each other).

Thus, the particle collector comprises an ultraviolet lamp 2 having a thin film of photoelectron emitting material 3 coated on the surface thereof as one unit, and an electrode 4 formed in a circular cylindrical configuration so as to surround the ultraviolet lamp 2.

In this example, the photoelectron emitting material 3 coated on the ultraviolet lamp 2 is Au of 100 Å in thickness.

Reference numeral 7 denotes photoelectrons. The arrows 12 show the flow at the inlet, while the arrows 13 show the flow at the outlet.

In this embodiment, the electrode 4 also serves as a light screening material.

Although in Embodiments 2 to 7 the photoelectron emitting material and the electrode, which surround the ultraviolet lamp, are each formed in a circular cylindrical configuration, it should be noted that the configurations of these elements are not necessarily limited to such circular cylindrical configurations and that any configuration whereby the ultraviolet lamp is surrounded may be adopted. For example, cylindrical configurations having a square, elliptical or triangular sectional configuration or those having a sectional configuration intermediate between these configurations may be properly used. Selection of a configuration may be properly made according to the scale of the stocker, the application field, the type of particle collector, effectiveness, the kinds of photoelectron emitting material and electrode material, etc.

It should be noted that the same reference numerals in the above-described Embodiments 1 to 7 denote the same meanings (functions).

Test 1

With the following sample gas introduced into a stocker having the same arrangement as that shown in FIG. 1, ultraviolet irradiation was carried out under application of a voltage to form an electric field, and the particle density in the stocker was measured by using a particle counter. The testing conditions and the results are as follows.

Testing Conditions

Stocker capacity:
  30 liters
Photoelectron emitting material:
  Silica glass coated with a thin film of Au.
Electrode material:
  A net-shaped Cu-Zn material installed at a position 1 cm from the photoelectron emitting material (a position of 0.03 with respect to the overall length (from the photoelectron emitting material to the opposing wall surface) of 1).
Light screening material:
  Stainless steel plates alternately installed at positions 1 cm and 1.5 cm from the electrode material, as shown in FIG. 1.
Charged particle collecting material:
  The electrode material also served as a charged particle collecting material.
Ultraviolet lamp:
  Germicidal lamp
Electric field voltage:
  50 V/cm
Sample gas (inlet gas):
  Medium gas . . . air
  Density (class) . . . 10,000 (class: the number of fine particles per ft$^3$ with particle size larger than 0.1 μm)
Irradiation time:
  30 minutes, 1 hour, and 16 hours.

Results

Particle densities for particle size larger than 0.1 μm were measured with a particle counter. The results are shown by the number of particles per ft$^3$ (class) in Table 1 below.

TABLE 1

| Irradiation time | Density (class: number of particles/ft$^3$) |
| --- | --- |
| 30 minutes | ≦2 |
| 1 hour | <2 |
| 16 hours | <2 |

As a blank, the particle density in the stocker after it had been allowed to stand for 1 hour without ultraviolet irradiation and voltage application was measured. The measured particle density was 85% with respect to the initial density (inlet density).

Test 2

A unitized particle collector as shown in FIGS. 4(a) and 4(b) was installed in a wafer stocker as shown in FIG. 3. With the following sample gas introduced into the stocker, ultraviolet irradiation and voltage application (charging and collection of particles) were carried out, and the particle density was measured by using a particle counter. The testing conditions and the results are as follows.

Testing Conditions

Stocker capacity:
  30 liters
Ultraviolet light source:
  Germicidal lamp (rod-shaped), 10 W
Photoelectron emitting material:
  Circular cylindrical silica glass having a thin Film of Au (50 Å) coated on the surface thereof.
Electrode material:
  A circular cylindrical net (Cu-Zn plated with Au) 2 cm greater in diameter than the photoelectron emitting material.
Charged particle collecting material:
  The electrode material also served as a charged particle collecting material.
Electric Field voltage:
  50 V/cm
Particle collector:
  A unit comprising the ultraviolet lamp (germicidal lamp), the circular cylindrical photoelectron emitting material surrounding the lamp, and the circular cylindrical net-shaped electrode surrounding the photoelectron emitting material, as shown in FIGS. 4(a) and 4(b).
Sample gas (inlet gas):

Gases as shown in Table 2 were used (class: number of particles per ft$^3$ with particle size larger than 0.1 μm).

TABLE 2

| Medium gas | Density (class) |
| --- | --- |
| air | 10,000,000 |
| air | 1,000 |
| nitrogen | 1,000 |

Charging and collecting time:
  30 minutes
Results

Particle densities for particle size larger than 0.1 μm were measured with a particle counter. The results are shown by the number of particles per ft$^3$ (class) in Table 3 below.

TABLE 3

| Medium gas | Density (class) | Density (class) |
| --- | --- | --- |
| air | 10,000,000 | <2 |
| air | 1,000 | <2 |
| nitrogen | 1,000 | <2 |

As a blank, the particle density in the stocker after it had been allowed to stand for 30 minutes without ultraviolet irradiation and voltage application was measured. The measured particle density was 90% with respect to the initial density (inlet density).

Test 3

Testing was conducted in the same way as in Test 2 except that a unitized particle collector as shown in FIG. 10 was employed, thereby measuring particle densities. The testing conditions and the results are as follows.

Testing conditions

Stocker capacity:
  30 liters
Ultraviolet light source:
  Germicidal lamp (rod-shaped). 10 W
Photoelectron emitting material:
  A thin film of Au (100 Å) coated on the surface the germicidal lamp.
Electrode material:
  A circular cylindrical Cu-Zn material (plated with Au) 2 cm greater in diameter than the ultraviolet lamp.
Charged particle collecting material:
  The electrode material also served as a charged particle collecting material.
Electric field voltage:
  50 V/cm
Particle collector:
  A unit comprising the ultraviolet lamp (germicidal lamp) having the thin film of Au (100 Å) coated on the surface of the lamp as a photoelectron emitting material, and the electrode material surrounding the ultraviolet lamp, as shown in FIG. 10.
Sample gas (inlet gas):
  Gases as shown in Table 4 were used.

TABLE 4

| Medium gas | Density (class) |
| --- | --- |
| air | 10,000,000 |
| air | 1,000 |
| nitrogen | 1,000 |

Charging and collecting time:
  30 minutes

Results

Particle densities for particle size larger than 0.1 μm were measured with a particle counter. The results are shown by the number of particles per ft$^3$ (class) in Table 5 below.

TABLE 5

| Medium gas | Density (class) | Density (class) |
| --- | --- | --- |
| air | 10,000,000 | <2 |
| air | 1,000 | <2 |
| nitrogen | 1,000 | <2 |

As will be understood from the above Examples, the advantageous feature of the present invention resides in that an ultra clean space, which Is cleaner than a "class 1 to 2" environment in terms of the particle density for particle size larger than 0.1 μm, can readily be achieved without forced circulation of the medium gas.

Although in the above-described Tests air and nitrogen were used as medium gases, the present invention can similarly be carried out in various other gases, e.g., argon, or in a vacuum or a condition close to a vacuum.

The present invention provides advantageous effects as stated below.

(1) The present Invention provides a stocker for accommodating, storing or transporting articles or valuables, which is comprised of at least an irradiation source, such as an ultraviolet light source, a photoelectron emitting material, an electric field forming electrode, and a charged particle collecting material. By virtue of this arrangement, the following advantages are provided:

① An ultra clean space (e.g., a space cleaner than a "class 1 to 2" environment in terms of the particle density for particle size larger than 0.1 μm) is effectively produced in a closed condition, that is, in a condition where basically no fluidization of gas is performed.

② Since handling (treatment) can be effected in the closed condition (stationary space), the handling (operation) is facilitated, and the apparatus is capable of achieving an ultra clean space with a compact structure.

③ Since it is also possible to collect effectively fine particles which are generated inside the stocker, the practicality further improves.

④ Since the cleaning operation can be effected in various kinds of gas, e.g., nitrogen, argon, etc., or in a vacuum or a condition close to a vacuum, the present invention is very useful in practical application.

(2) The space where a particle collecting part is present and the other space may be divided by an energy screening material. Accordingly, the following advantages are provided:

① Since no irradiation energy like ultraviolet light is applied to articles accommodated in the stocker, the stocker can also be used for articles which may be adversely affected by irradiation (e.g., semi-fabricated products coated with a sensitive thin film). Thus, the application range enlarges, and the practicality improves.

② Even if the ultraviolet light source is used as an irradiation source and it includes short wavelength ultraviolet light, the ultraviolet light is not applied to the space to be treated, so that no fine particles are generated from the space to be treated.

(3) The energy screening material may be formed in a configuration selected from among a plate-shaped configuration, a lattice-shaped configuration, a pleated configuration, a net-shaped configuration, and a configuration with a curved surface, or a combination of two or more selected from among these configurations, and the energy screening material may be installed in between the particle collecting part and the space to be treated, with openings provided therein so as to provide communication between these two parts. By virtue of this arrangement, fine particles in the space (A) to be treated move to the particle collecting part (B) by diffusion, and the particles are effectively charged by photoelectrons in the part (B).

(4) By forming the energy screening material from a photoelectron emitting material, photoelectrons may also be emitted from the energy screening material. Thus, the fine particles are charged even more effectively.

(5) If the ultraviolet light source is used as an irradiation source and it is surrounded by the photoelectron emitting material and the electrode to thereby form a unitized particle collector, the following advantages are provided:

① A compact particle collector is obtained.

② Since the ultraviolet light source is surrounded by the photoelectron emitting material in the unitized particle collector, ultraviolet light emitted from the ultraviolet light source can effectively be utilized without loss. By installing the photoelectron emitting material so as to surround ultraviolet light that is emitted radially, for example, ultraviolet light emitted in all directions can be applied to the photoelectron emitting material.

③ Since the electrode is installed in the vicinity of the photoelectron emitting material in the unitized particle collector, the voltage applied to form an electric field can be lowered. In addition, since the electric field is formed in a small space defined between the photoelectron emitting material and the electrode, the effect of the electric field on the space to be cleaned is ignorable.

④ Since ultraviolet light emitted in all directions can be effectively utilized, when an ultraviolet lamp is employed as an ultraviolet light source, it is possible to reduce considerably the number of lamps used in comparison to the prior art system. Consequently, the power consumption decreases. In addition, the performance of the particle collector improves.

⑤ Since the unitized particle collector can be installed at any desired position in the space, the cleaning capability improves.

In the case of a large-scale stocker, e.g., a stocker having a capacity of more than several 100 l, cleaning can be effected particularly effectively. That is, when the capacity is large, fine particles present in the space take a relatively long time to move to the particle collector by diffusion. Therefore, in such a case, a proper number of unitized particle collectors are installed at proper positions in the large space of the stocker. Thus, an ultra clean space is obtained even more effectively.

⑥ Although the particle collector in the prior art limits the stocker structure, the unitized particle collector places no limitation by virtue of the advantage 5. In other words, the freedom for design of the stocker increases.

⑦ Although it is difficult to improve the cleaning capacity (i.e., the rate of cleaning) of the prior art stocker over the initial design value thereof, the present invention enables the cleaning capacity to be readily improved because it is possible to install more unitized particle collectors at any desired positions.

⑧ The range of application fields enlarges, and the practicality improves.

(6) If the ultraviolet light source is used as an irradiation source and it and the photoelectron emitting material are united together as a photoelectron emitting source, the following advantages are provided:

① Since the photoelectron emitting material can be irradiated with ultraviolet light at a position very close to the ultraviolet light source, the photoelectron emitting effect (performance) improves.

② Since the photoelectron emitting effect improves and stabilizes, fine particles can be charged even more effectively (efficiently and stably for a long time).

③ Since fine particles can be effectively charged, it is possible to reduce the overall size of the apparatus (i.e., a compact apparatus can be realized). In addition, tile throughput capacity increases. Further, the degree of freedom with which the stocker can be designed increases.

What is claimed is:

1. A stocker for accommodating, storing or transporting articles, comprising a particle collector provided in a part of said stocker, said particle collector including an irradiation source, a photoelectron emitting material that emits photoelectrons when irradiated by said irradiation source, and an electrode for forming an electric field between said photoelectron emitting material and said electrode, and the electrode forming a charged particle collecting material, wherein a space where said particle collector is provided is partitioned from a remaining space in said stocker by an irradiation energy screening material to prevent direct irradiation of said remaining space by said irradiation source.

2. A stocker according to claim 1, wherein said irradiation energy screening material comprises a plurality of metal plates provided in combination with each other in such a way that openings are provided between said metal plates for communication between said space where said particle collector is provided and said remaining space.

3. A stocker according to any one of claims 1 or 2, wherein said irradiation source comprises an ultraviolet light source.

4. A stocker according to any one of claims 1 or 2, wherein said irradiation source comprises an electromagnetic wave.

5. A stocker according to any one of claims 1 or 2, wherein said irradiation source comprises a laser source.

6. A stocker according to any one of claims 1 or 2, wherein said irradiation source comprises a radiation source.

7. A stocker according to claim 3, wherein said ultraviolet light source is provided outside of said stocker at one side of said stocker, said photoelectron emitting material forms a part of a side wall of said stocker, a reflector is provided for directing ultraviolet light from said ultraviolet light source to said photoelectron emitting material, and said electrode is provided inside of said stocker opposing said photoelectron emitting material.

8. A stocker according to claim 3, wherein said particle collector is formed as a unit by surrounding said ultraviolet light source with said photoelectron emitting material and said electrode.

9. A stocker according to claim 8, wherein said ultraviolet light source is an ultraviolet lamp, said photoelectron emitting material is formed from a cylindrical glass base material coated with a photoelectron emitting substance and surrounds said ultraviolet lamp, and said electrode is a grid electrode formed in a cylindrical configuration and surrounds said photoelectron emitting material.

10. A stocker according to claim 8, wherein said ultraviolet light source is an ultraviolet lamp, said electrode is a grid electrode formed in a cylindrical configuration and surrounds said ultraviolet lamp, and said photoelectron emitting material is a grid photoelectron emitting material formed from a cylindrical metal base material coated with a photoelectron emitting substance and surrounds said electrode.

11. A stocker according to claim 8, wherein said ultraviolet light source is an ultraviolet lamp, said photoelectron emitting material is provided in the form of a thin film on a surface of said ultraviolet lamp as one unit, and said electrode is a grid electrode formed in a cylindrical configuration and surrounds said ultraviolet lamp provided with said photoelectron emitting material thereon.

12. A stocker according to claim 8, wherein said ultraviolet light source is an ultraviolet lamp, said electrode is a grid electrode formed in a cylindrical configuration and surrounds said ultraviolet lamp, and said photoelectron emitting material is formed from a cylindrical metal base material coated with a photoelectron emitting substance and surrounds said electrode.

13. A stocker according to claim 12, wherein an air flow passage is formed by an annular space between said photoelectron emitting material and said electrode and fine particles in said stocker are carried by said air flow into the annular space between said photoelectron emitting material and said electrode.

14. A stocker according to claim 8, wherein said ultraviolet light source is an ultraviolet lamp, said photoelectron emitting material is formed from a cylindrical glass base material coated with photoelectron emitting substance and surrounds said ultraviolet lamp, and said electrode is formed in a cylindrical configuration and surrounds said photoelectron emitting material, wherein said electrode also serves as a light screening material and said charged particle collecting material.

15. A stocker according to claim 14, wherein an air flow passage is formed by an annular space between said photoelectron emitting material and said electrode and fine particles in said stocker are carried by said air flow into the annular space between said photoelectron emitting material and said electrode.

16. A stocker according to claim 8, wherein said ultraviolet light source is an ultraviolet lamp, said photoelectron emitting material is provided in the form of a thin film on a surface of said ultraviolet lamp as one unit, and said electrode is formed in a cylindrical configuration and surrounds said ultraviolet lamp provided with said photoelectron emitting material thereon, wherein said electrode also serves as a light screening material and said charged particle collecting material.

17. A stocker according to claim 16, wherein an air flow passage is formed by an annular space between said photoelectron emitting material and said electrode and fine particles in said stocker are carried by said air flow into the annular space between said photoelectron emitting material and said electrode.

* * * * *